United States Patent [19]

Kucharek

[11] Patent Number: 4,943,686
[45] Date of Patent: Jul. 24, 1990

[54] SEAL FRAME AND METHOD OF USE

[76] Inventor: Andrzej Kucharek, 555 W. Middlefield Rd., Suite A 310, Mountain View, Calif. 94043

[21] Appl. No.: 182,626

[22] Filed: Apr. 18, 1988

[51] Int. Cl.$^5$ .............................................. H05K 5/06
[52] U.S. Cl. ..................................... 174/52 F; 220/66; 220/200; 220/359; 403/336
[58] Field of Search ........................ 174/52 FP, 52 S; 357/74; 220/66, 200, 359

[56] References Cited

U.S. PATENT DOCUMENTS 4,547,624 10/1985 Tower et al. ........................ 174/52.5

FOREIGN PATENT DOCUMENTS 1144582 3/1969 United Kingdom .............. 357/74 C

Primary Examiner—A. T. Grimley
Assistant Examiner—David A. Tone
Attorney, Agent, or Firm—Philip A. Dalton

[57] ABSTRACT

A sealing frame arrangement is disclosed for creating a hermetic seal between two components or bodies such as a connector and heat sink module of an integrated circuit package. The frame members are configured to fit together along facing surfaces and to be joined to the two bodies along the inner edge of their outside (non-facing) surfaces. The sealing arrangement is completed by a third seal formed along the outer facing edge of the frames. The frames extend a sufficient distance beyond the two components to permit severing the frames inside the third seal and resealing. Preferably, the frames are of sufficient width to provide a multiplicity of sealing regions so that the third seal can be broken and resealed a number of times. The seal frames may be of stepped or corrugated configuration in which the individual seals are formed along the mating steps.

2 Claims, 2 Drawing Sheets

SEAL FRAME AND METHOD OF USE

BACKGROUND OF THE INVENTION

The present invention relates to a mating, resealable frame arrangement which facilitates sealing, desealing and resealing of bodies, such as, for example, the heat sink and connector components used in IC (integrated circuit) chip mounting and cooling packages.

Typically, integrated circuit packages are joined along constituent package components such as the heat sink module, integrated circuit connector and substrate. Disassembling or opening such a package for repair or reworking involves breaking a seal, such as that between the heat sink and IC connector, to provide internal access to the package. Following reworking, the package seal must be broken, for example, by heating, and the package is then resealed along the same surfaces and it is time consuming and difficult to break the seal, to clean and reseal the surfaces and to obtain a good second seal.

SUMMARY OF THE INVENTION

In view of the above discussion, it is one object of the present invention to provide a fixture and a method which afford readily resealable sealing between bodies or components.

It is a related object to provide such a sealing fixture which can be readily broken and resealed a plural or multiple number of times.

These and other objects of the present invention are achieved in a sealing arrangement for sealing first and second bodies or components of, e.g., an IC package, which comprises (A) a first body having a surface; (B) a second body for mating with the first body surface; and (C) a sealing frame arrangement for sealing the first body surface to the mating second body surface, comprising first and second frames having outer surfaces of configuration matched to the configuration of, respectively, the first and second body surfaces, and having mating facing inner surfaces. The first frame is sealed to the first body surface at a first location defined along the outer surface of said first frame; the second frame is sealed to the second body surface at a second location defined along the outer surface of said second frame; and the first and second frames are sealed at a third location defined along their facing inner surfaces.

Preferably, the frames extend outside the first and second body surfaces such that the third seal is spaced from the first and second body surfaces, thereby defining space for severing said frames inside the third seal and for resealing the frames inside said severed location at least once.

The third seal may be formed in mating flat sections of the frame or, alternatively, the frames may be of stepped configuration and the positions of the third seal are formed in mating steps thereof.

BRIEF DESCRIPTION OF THE DRAWING

The above and other aspects of my present invention are described in the drawing, in which.

DETAILED DESCRIPTION OF THE PREFERRED EMBODIMENT(S)

Figure 1:
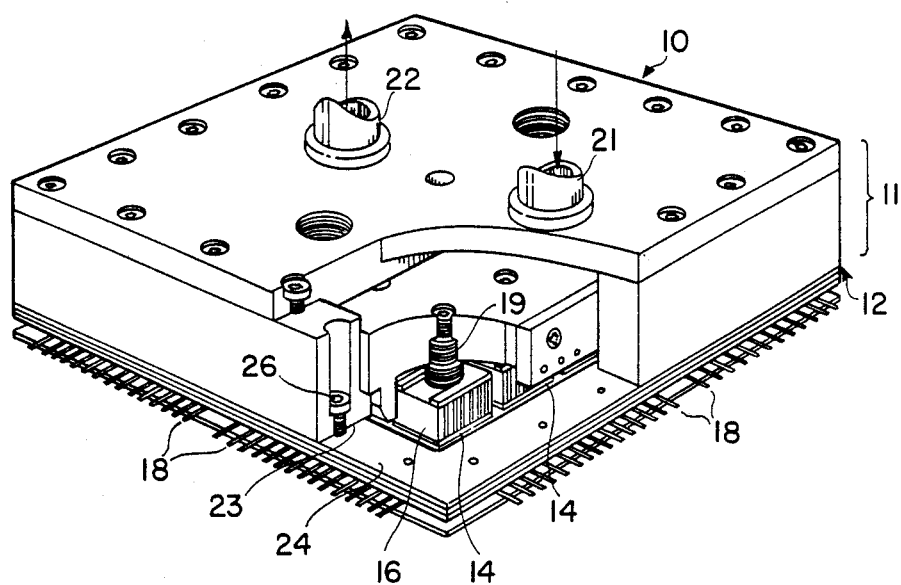
FIG. 1 is a partially cutaway perspective view of a high density multi-chip interconnection and cooling package described in my below-referenced co-pending, allowed patent application (the illustrated package is exemplary of the many types of bonded bodies, including housing components and the like, which benefit from use of the sealing arrangement and method of the present invention)

FIG. 1 is a partially cutaway perspective view of an assembly 10 which benefits from the use of my resealing frame sealing arrangement and comprises one body or component 11 which is sealed to another body or component 12 along mating surfaces. While FIG. 1 depicts a multiple chip integrated circuit package assembly 10, it also represents more generally the applicability of my present invention to sealing one body or member to another and to sealing various types of ic packages. Referring further to FIG. 1, the IC package 10 comprises a heat sink module 11 joined to the top of an IC connector assembly 12 which in turn is joined to an underlying substrate assembly (not evident in the figure). The connector assembly 12 mounts an array of integrated circuits 14 which are cooled by the heat sink assembly 11. More specifically, the connector assembly 12 mounts one or several integrated circuit chips 14 in a flexible sheet-like membrane which conforms the orientation of the individual chips to the associated substrate and heat sinks 16; connects the chip signal contacts to an array of substrate signal pins/terminals (the substrate and associated pins are not evident in FIG. 1) for connection to external circuits such as those contained in a mother board; and also connects the chip power contacts to a peripheral array of power supply pins 18. The cooling heat sink module 11 contains the individual spring 19-biased, conformal heat sink elements or modules 16 that adapt to the orientation of the associated individual chips 14. Fluid coolant is flowed between I/0 ports 21/22 and through the modules 16 to provide cooling of the chip array. Typically, lower surface 23 of the heat sink module 11 is joined to connector mating upper surface 24 using screws 26 to mechanically join the surfaces and using solder between the surfaces to provide an hermetic seal. Chip assembly 10, which is described in my co-pending, U.S. Pat. No. 763,957, filed Aug. 8, 1985, entitled "High Density Multi-Chip Interconnection and Cooling Package" now U.S. Pat. No. 4,748,495, issued May 31, 1988, (which application, is hereby incorporated by reference in its entirety), is an excellent example of a sophisticated multi-chip interconnection and cooling assembly which gains disproportionate benefits from the incorporation of my simple, inexpensive sealing invention.

Figure 2:
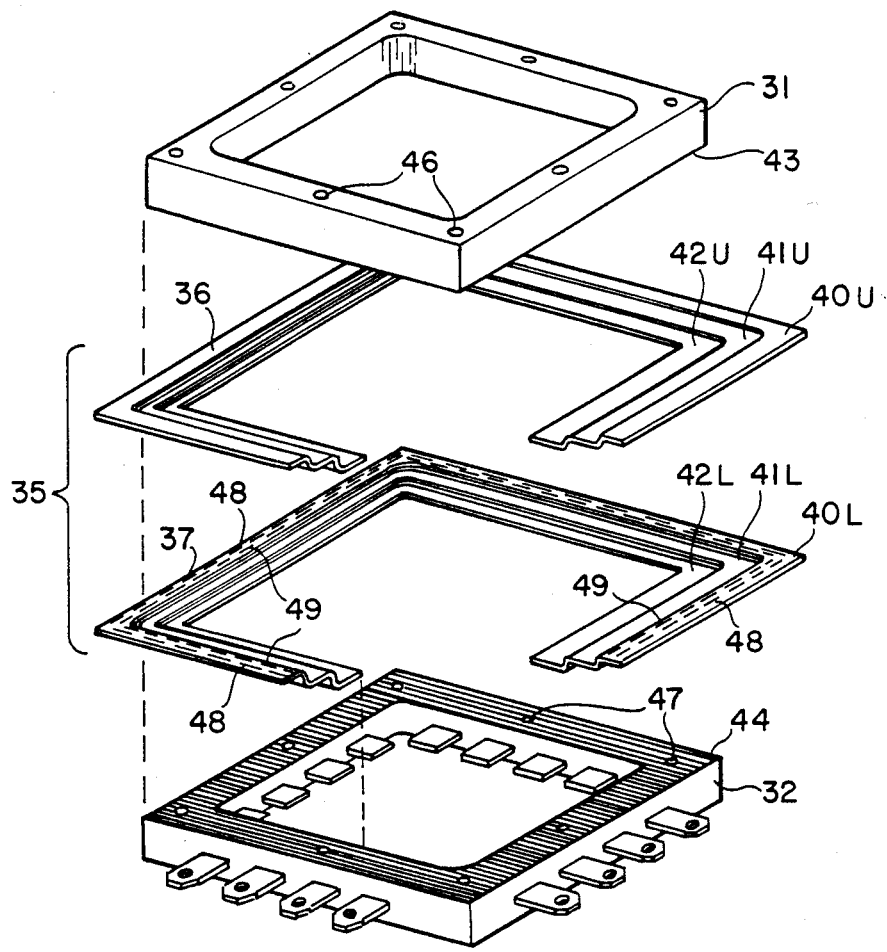
FIG. 2 is an exploded perspective view of an IC interconnection and cooling package which incorporates the resealable sealing frame arrangement of my present invention.

FIG. 2 is a partial, simplified exploded view of an assembly of mating components such as the outside wall 31 of a heat sink module and the frame 32 of a connector module which are hermetically sealed using a sealing frame assembly 35 which embodies my present invention. The sealing frame assembly 35 comprises two thin, typically metal, mating fixtures or frames 36 and 37. As illustrated, the frames may be stepped or corrugated so that corresponding regions such as 40U-40L, 41U-41L and 42U-42L mate. That is, the peripheral regions 40, 41 and 42 in the upper frame 36 and the lower frame 37 form mating complementary surfaces.

Figure 3:
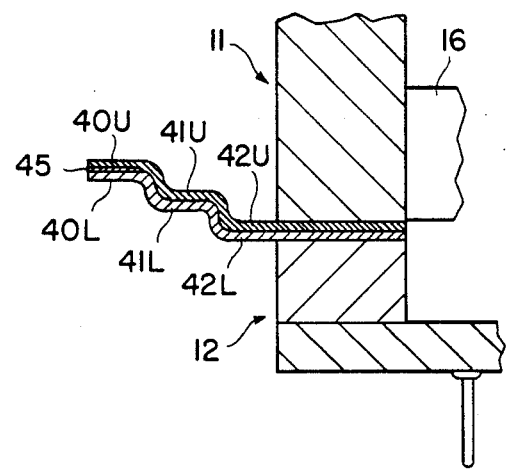
FIG. 3 is a vertical cross-sectional view of an integrated circuit package which incorporates my resealable sealing frame arrangement.

To implement sealing, and referring to FIG. 3 as well as FIG. 2, the inner edge 42U of the outer surface of the upper frame 36 is joined to the associated, mating lower surface 43 of component 31 by means of welding, brazing or other suitable bonding techniques, thereby providing a first seal, which is permanent. The inner edge 42U of the outer surface of the other, lower frame member 37 of the assembly 35 is similarly bonded to the upper surface 44 of the component 32, providing a second seal, which is permanent.

When the components 31 and 32 are assembled, the frame halves 36 and 37 are welded, brazed or otherwise joined together, typically, along the outermost edges 40U-40L of their facing inner surfaces, to form an initial third seal 45 which completes the hermetic sealing of the assembly. This third seal is sacrificial; in combination with the two permanent seals and the remaining, potential seal regions such as 41U-41L, it permits repetitive unsealing, separation and resealing of the components 31 and 32.

Optionally, the joined structure can be mechanically held together by screws (not shown) which are applied, for example, through holes 46 in one component and are screwed into tapped holes 47 in the mating component. The optional use of the bolts or other mechanical joining means is beneficial in that the frames 36 and 37 can be formed of materials and can be bonded one to the other and to the joined components 31 and 32 using materials and joining techniques which optimize hermetic or other desired sealing qualities, without regard to great mechanical strength. Alternatively, and quite obviously, as is well known in the art, adequate sealing qualities such as hermetic sealing and mechanical strength can be provided by the sealed frame itself.

As alluded to above, when it is necessary to disassemble and separate the components (for example, when the components 31 and 32 are part of a sealed integrated circuit package and it is desired to access the inside of the package for reworking or repair), the sacrificial third seal between the border sections 40U and 40L is removed by cutting, machining, etc., the frames inside the seal and the screws or other clamping/retaining means are loosened. For reassembly, a new third seal is made, typically along the outermost remaining border sections 41L and 41U. The new sacrificial seal in combination with the two permanent inner seals hermetically seals the assembly again. The process of unsealing and resealing may be repeated an indefinite number of times, limited only by the number of sequential peripheral sealing regions that are provided in the mating frame sections 36 and 37.

It should be noted that the corrugated or stepped form of the seal frame shown in FIG. 2 is used to increase structural stability but is not necessary for functionality of the seal. For example, the mating frames can be flat. Regardless of the frame configuration, the sacrificial seal is conveniently implemented by applying solder preform along the frames as indicated schematically, by the broken line 48, FIG. 2. Also, concentric bands of material such as nickel of predetermined thickness can be applied around the innermost edge of each seal region adjacent the solder, as indicated schematically, by the broken line 49, FIG. 2, to establish a predetermined seal thickness and to prevent inward solder flow during sealing.

To illustrate representative, but certainly not exhaustive, examples of my present, invention, consider its use in the above-described IC packaging technology. Heat sink housing/component 11 typically may be formed of material such as copper or molybdenum while connector 12 may be copper, molybdenum, ceramic or other material. Representative materials for the frames 36 and 37 include copper, molybdenum, brass, etc. The first and second seals between frame 36 and component 11 and between frame 37 and component 12 can be brazed joints which are formed at relatively high temperatures of approximately 300°C. or above, that is, somewhat above the temperatures used for the assembly of the rest of the package such as that used for ic chip termination to avoid degradation of the first and second joints. The presently preferred associated technique for the third seal, that between the outer inside surfaces of the frames 36 and 37, is to use solder and to form the soldered joint at a typical temperature of about 200°C. or less. The above temperatures are for copper heat sink, connector and frame components, but those of usual skill in the art will readily adjust the temperatures to other useful materials.

It is to be understood that various modifications will be readily made in the structure and use of my above-described sealing frame arrangement which are within the scope of the present invention described here. It is, thus, to be understood that the invention is limited only by the appended claims and their equivalents.

Having thus described preferred and alternative embodiments of my seal frame arrangement and method of sealing, what is claimed is:

1. A sealed assembly, comprising:
   (a) a first body having a surface;
   (b) a second body having a surface for mating with the first body surface;
   (c) a sealing frame arrangement for sealing the first body surface to the mating second body surface, comprising first and second frames having outer surfaces of configuration matched to the configuration of, respectively, the first and second body surfaces, and having mating facing inner surfaces;
   said first frame being sealed to the first body surface at a first location defined along the outer surface of said first frame; the second frame being sealed to the second body surface at a second location defined along the outer surface thereof of said second frame; and the first and second frames being sealed at a third location defined along the facing inner surfaces thereof;
   said frames extending outside the first and second body surfaces such that the third seal is spaced from the first and second body surfaces thereby defining a first space for severing said frames inside the third seal and for resealing the frame inside said severed location; and
   wherein the frames are of stepped configuration and the third seal is formed in mating steps thereof.

2. A sealed assembly, comprising:
   (a) a first body having a surface;
   (b) a second body having a surface for mating with the first body surface;
   (c) a sealing frame arrangement for sealing the first body surface to the mating second body surface, comprising first and second frames having outer surfaces of configuration matched to the configuration, of, respectively, the first and second body surfaces, and having mating facing inner surfaces;
   said first frame being sealed to the first body surface at a first location defined along the outer surface of said first frame; the second frame being sealed to the second body surface at a second location defined along the outer surface thereof of said second frame; and the first and second frames being sealed at a third location defined along the facing inner surfaces thereof;

said frames extending outside the first and second body surfaces such that the third seal is spaced from the first and second body surfaces thereby defining a first space for severing said frames inside the third seal and for resealing the frames inside said severed location, said frames further comprising space inside the resealing space for severing and resealing the frames at least a second time; and wherein the frames are of stepped configuration and the third seal is formed in mating steps thereof.

* * * * *